(12) United States Patent
Johnson et al.

(10) Patent No.: US 6,472,232 B1
(45) Date of Patent: Oct. 29, 2002

(54) SEMICONDUCTOR TEMPERATURE MONITOR

(75) Inventors: Donna K. Johnson, Underhill, VT (US); Jerome B. Lasky, Essex Junction, VT (US); Glenn R. Miller, Essex Junction, VT (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/510,262

(22) Filed: Feb. 22, 2000

(51) Int. Cl.$^7$ .............................................. G01R 31/26
(52) U.S. Cl. ........................ 438/14; 438/17; 438/530; 438/795
(58) Field of Search .......................... 438/14, 17, 514, 438/527, 528, 530, 795

(56) References Cited

U.S. PATENT DOCUMENTS

| | | | |
|---|---|---|---|
| 4,203,799 A | | 5/1980 | Sugawara et al. |
| 4,732,108 A | | 3/1988 | Erickson |
| 4,762,801 A | * | 8/1988 | Kapoor |
| 4,823,073 A | | 4/1989 | Schober |
| 4,928,156 A | * | 5/1990 | Alvis |
| 5,242,507 A | | 9/1993 | Iverson |
| 5,606,179 A | | 2/1997 | Yamazaki et al. |
| 5,808,321 A | | 9/1998 | Mitanaga et al. |
| 5,821,562 A | | 10/1998 | Makita et al. |
| 5,914,611 A | | 6/1999 | Cheng |
| 5,970,313 A | * | 10/1999 | Rowland et al. ............... 438/17 |
| 6,037,640 A | * | 3/2000 | Lee ............................. 257/408 |

* cited by examiner

*Primary Examiner*—Savitri Mulpuri
(74) *Attorney, Agent, or Firm*—Schmeiser, Olsen & Watts; William D. Sabo (57) ABSTRACT

A method, and associated structure, for fabricating a semiconductor wafer that may be used to monitor the temperature distribution across the wafer surface. Given a substrate that includes a semiconductor material and a first dopant, an amorphous layer is formed from a top portion of the substrate, and the amorphous layer is doped with a second dopant of polarity opposite to a polarity of the first dopant. The amorphous layer may be formed by directing an ionic species, such as ionic germanium, into the top portion of the substrate. Alternatively, particular second dopants, such as arsenic, may serve to also amorphize the top portion of the substrate. Next, the wafer is heated to a temperature in a range of 450 to 625° C. The heating of the wafer recrystallizes a portion of the amorphous layer that is adjacent to the substrate at a recrystallization rate that depends on a local temperature on the wafer surface. After being heated, the wafer is removed and a sheet resistance is measured at points on the wafer surface. Since the local sheet resistance is a function of the local thickness of the recrystallized layer, a spatial distribution of sheet resistance over the wafer surface reflects a distribution of wafer temperature across the wafer surface during the heating of the wafer. The measured spatial distribution of sheet resistance may be utilized to readjust the spatial distribution of heat input to another wafer in order to achieve a more uniform temperature across the other wafer's surface.

14 Claims, 6 Drawing Sheets

SEMICONDUCTOR TEMPERATURE MONITOR

BACKGROUND OF THE INVENTION

1. Technical Field

The present invention relates to a method of fabricating a semiconductor wafer, and an associated structure, for monitoring a temperature distribution across a surface of the wafer.

2. Related Art

Annealing or otherwise heating a semiconductor wafer at a uniform temperature in a range of 450–625° C. may be required in a process that fabricates a semiconductor device. In order to ensure that a heating chamber used for the annealing is at the desired uniform temperature, particularly at a local space within the heating chamber at which the semiconductor wafer is positioned, it is necessary to monitor the temperature distribution within the local space of the heating chamber.

There is a known temperature monitor that can be used in the temperature range of 500° C. to 625° C. This known temperature monitor anneals a sputtered cobalt metal on silicon to form CoSi and $CoSi_2$, and measures temperature variations in accordance with a stochiometry of the CoSi, the $CoSi_2$, and an interfacial oxide. However, this known temperature monitor is difficult to use, since it requires two separate chemical stripping steps following the annealing. Another disadvantage is that this monitor is expensive to build and cannot be reused. Additionally, this monitor may not be sufficiently sensitive to the temperature distribution across the wafer, since the nonuniform sputtering of cobalt results in a wafer thickness variations from a center of the wafer to an edge of the wafer.

A simple method is needed for accurately monitoring a temperature distribution in a heating chamber in the 450–625° C. temperature range.

SUMMARY OF THE INVENTION

The present invention provides a method for fabricating a semiconductor wafer, comprising the steps of:
 providing a substrate that includes a semiconductor material having a first dopant;
 forming an amorphous layer from a top portion of the substrate; and
 doping the amorphous layer with a second dopant, wherein a polarity of the second dopant is opposite to a polarity of the first dopant.

The present invention provides a semiconductor wafer, comprising:
 a substrate that includes a semiconductor material and a first dopant; and
 an amorphous layer on the substrate, wherein the amorphous layer includes a second dopant, and wherein a polarity of the second dopant is opposite to a polarity of the first dopant.

The present invention provides a semiconductor wafer, comprising:
 a substrate that includes a semiconductor material and a first dopant;
 an amorphous layer coupled to the substrate, wherein the amorphous layer includes the semiconductor material and a second dopant, and wherein a polarity of the second dopant is opposite to a polarity of the first dopant; and
 a crystal layer interposed between the amorphous layer and the substrate, wherein the crystal layer includes a crystal structure comprising the second dopant at a plurality of lattice points of the crystal structure.

The present method has the advantage of using a temperature monitor to accurately monitor a temperature distribution in a heating chamber in a 450–625° C. temperature range. Additionally, the temperature monitor is reliable, easy to use, inexpensive to fabricate, and reusable.

DETAILED DESCRIPTION OF THE INVENTION

Figure 1:
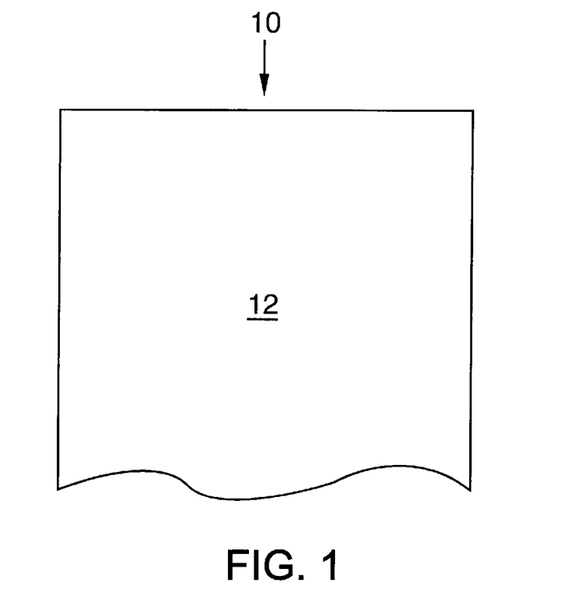
FIG. 1 depicts a front cross-sectional view of a semiconductor wafer having a substrate, in accordance with the preferred embodiment of the present invention.
Figure 2:
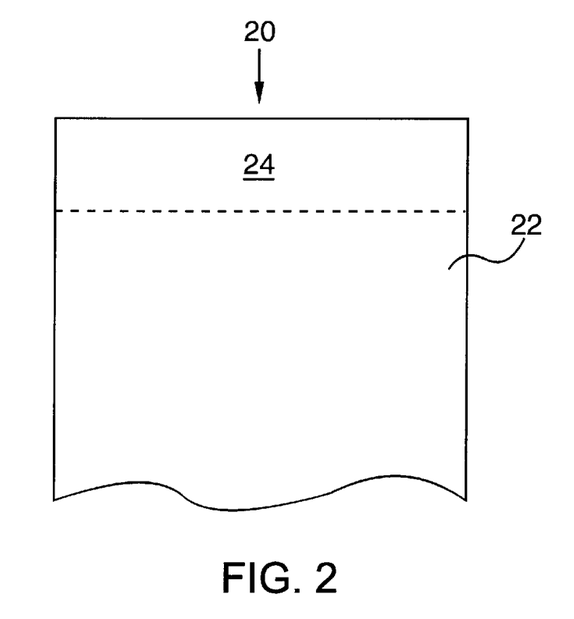
FIG. 2 depicts a semiconductor wafer having a substrate that includes an epitaxial layer, in accordance with the preferred embodiment.

FIG. 1 illustrates a front cross-sectional view of a semiconductor wafer 10 having a substrate 12, in accordance with the preferred embodiment of the present invention. The substrate 12 includes a semiconductor material that is doped with—type material (e.g., arsenic, phosphorus, bismuth, lead), doped with P-type material (e.g., boron, indium, gallium), or not doped. The semiconductor material preferably includes silicon, but may alternatively include other semiconductor substances such as gallium arsenide or germanium. The doping concentration in the substrate 12 should be less than about $10^8$ atoms/cm$^3$. FIG. 2 illustrates a front cross-sectional view of a semiconductor wafer 20 having a substrate 22, and including an epitaxial layer 24 as a top portion of the substrate 22, in accordance with the preferred embodiment. The substrate 22 and the included epitaxial layer 24 each includes a semiconductor material that is doped with N-type material, doped with P-type material, or not doped. The doping concentration in the substrate 22 should be less than about $10^{18}$ atoms/cm$^3$. Note that the present invention works properly regardless of whether the epitaxial layer 24 is present in the wafer 20.

Figure 3:
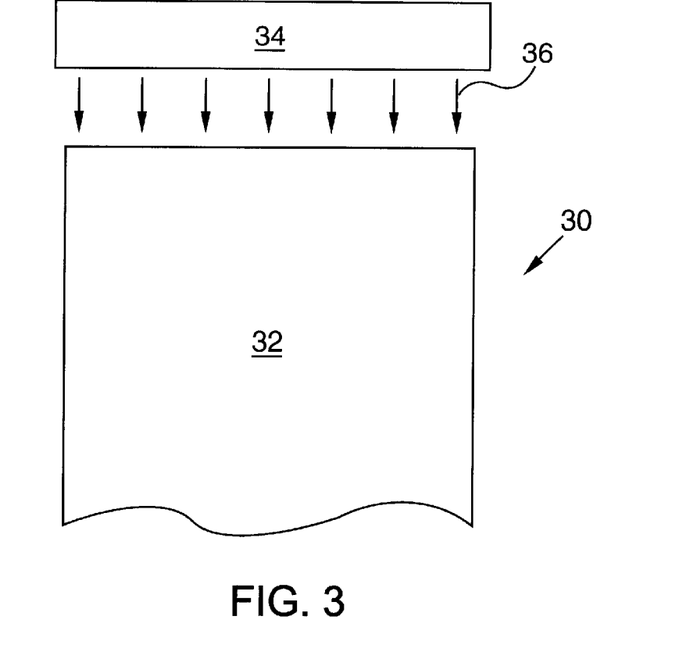
FIG. 3 depicts the wafer of either FIG. 1 or FIG. 2 with energized ions directed into the wafer.

FIG. 3 illustrates a front cross-sectional view of a semiconductor wafer 30 in accordance with the preferred embodiment, wherein the wafer 30 includes a substrate 32 and represents either the wafer 10 of FIG. 1 or the wafer 20 of FIG. 2. If the wafer 30 represents the wafer 10, then the wafer 30 does not include an epitaxial layer. If the wafer 30 represents the wafer 20, then the substrate 32 is understood to include an epitaxial layer in its top portion even though the epitaxial layer is not explicitly shown in FIG. 3. As stated previously, the present invention does not depend on whether there is an epitaxial layer in the wafer 30.

FIG. 3 depicts a source 34 of energized ions 36. The energized ions 36 are directed into the substrate 32 to amorphize a top portion of the substrate 32 (or a top portion of the epitaxial layer if the substrate 32 includes the epitaxial layer). The amorphization destroys the crystal structure at the top portion of the substrate 32 to form an amorphous layer 40 shown in FIG. 4, wherein the ions 36 are implanted within the amorphous layer 40. The amorphous layer 40 will be subsequently recrystallized to form a recrystallized layer upon heating, as will be described infra in conjunction with FIGS. 5–7, and the ions 36 will be moved into crystal lattice positions within the recrystallized layer. The recrystallized layer preferably has a substantially reduced electrical resistance in contrast with a relatively higher electrical resistance of the amorphous layer 40. Consequently, the ions 36 should be of a type that both amorphizes the top portion of the substrate 32 and substantially reduces the electrical resistance of the subsequently formed recrystallized layer. The preceding implantation approach is a "single-implantation" approach and is characterized by implantation of a single ionic species to achieve both the amorphization and the lowering of electrical resistance upon recrystallization of the amorphous layer 40. Suitable ionic species of the ions 36 for the single-implantation approach include arsenic ions ($As^+$) and indium ions ($In^+$).

Figure 4:
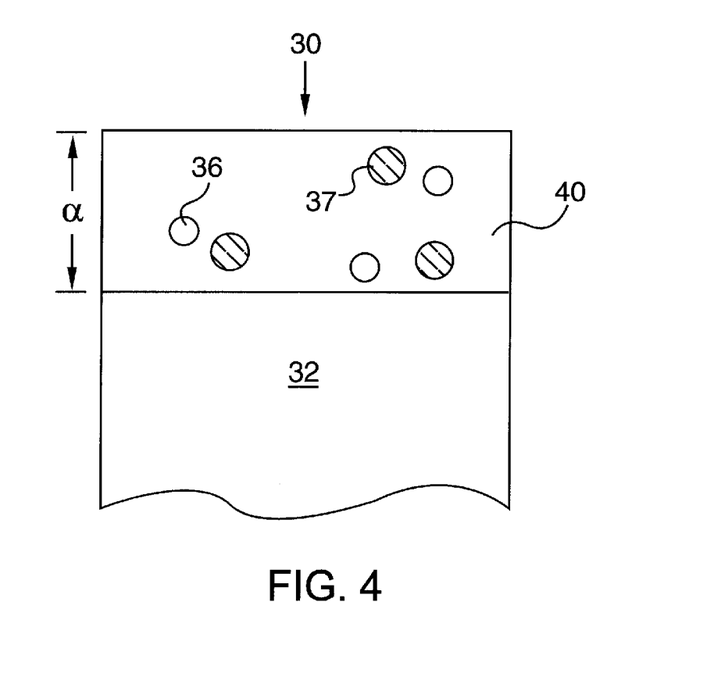
FIG. 4 depicts the wafer of FIG. 3 after an amorphous layer has been formed on a top portion of the substrate.

An alternative implantation approach, called a "double-implantation" approach, is suitable for the present invention. The double-implantation approach comprises two individual ionic implantations in sequence: an implantation of the ions 36 followed by an implantation of ions 37, wherein the ions 37, as shown in FIG. 4, are of a different ionic species than the ions 36. With the double-implantation approach, the ion source 34 in FIG. 3 represents both a first source and a second source. The first source directs the energized ions 36 into the substrate 32 to amorphize a top portion of the substrate 32, wherein the ions 36 do not have a capability of sufficiently lowering the electrical resistance of the subsequently recrystallized layer to an extent needed for purposes of the present invention. Suitable ionic species for the ions 36 for the double-implantation approach include germanium ions ($Ge^+$) and silicon ions ($Si^+$). The second source directs the energized ions 37 into the substrate 32 for lowering the electrical resistance of the subsequently recrystallized layer. Suitable ionic species for the ions 37 for the double-implantation approach include phosphorus ions ($P^+$) and boron ions ($B^+$). A preferred double-implantation approach is implanting germanium ions ($Ge^+$) for the ions 36, followed by implanting phosphorus ions ($P^+$) for the ions 37. For definitional purposes, the "resistance-lowering ions" are the ions 36 if the single-implantation approach is used, or the ions 37 if the double-implantation approach is used. Note that the preceding discussion assumes that the implantation of the ions 36 precedes the implantation of ions 37. Nonetheless, the present invention will also work properly if the implantation of the ions 36 follows the implantation of ions 37, such as by implanting with $Ge^+$ after implanting with $P^+$.

The amorphous layer 40 in FIG. 4 will have a thickness a that is a function of an implantation energy of the directed ionic species 36, and also of an implantation energy of the directed ionic species 37 if the double-implantation approach is employed. The amorphous layer thickness a increases with increasing implantation energy. If the double-implantation approach is employed, with the ionic species 36 and the ionic species 37 penetrating the substrate 32 to different depths, the effective value of at for the present invention defines a top portion of the substrate 32 into which both the ionic species 36 and the ionic species 37 have penetrated. Thus it is desirable, but not mandatory, for the ionic species 36 and the ionic species 37 to penetrate the substrate 32 to about the same depth. A suitable energization for the double-implantation approach is, inter alia, $^{74}Ge^+$ at about 40 Kev for the ionic species 36 to cause an implantation density of about $5\times10^{14}$ atoms/cm$^3$, followed by $^{31}P^+$ at about 15 Kev for the ionic species 37 to cause an implantation density of about $5\times10^{15}$ atoms/cm$^3$.

The resistance-lowering ions have a polarity that is preferably opposite to a polarity of the substrate dopant. Thus if the substrate 32 is doped with N-type material, then the resistance-lowering ions should include P-type material. Similarly, if the substrate 32 is doped with P-type material, then the resistance-lowering ions should include N-type material. A purpose of the aforementioned preferred polarity is to generate a depletion region at a PN junction at the substrate-amorphous layer interface, with a barrier potential that will inhibit current flow into the substrate when a sheet resistance of the wafer 30 is subsequently measured as will be discussed infra in conjunction with FIG. 8. If the aforementioned preferred polarity is not followed, the present invention would still work, but would require additional calculations to specifically account for current flow through the substrate 32 when the sheet resistance of the wafer 30 is subsequently measured.

Figure 5:
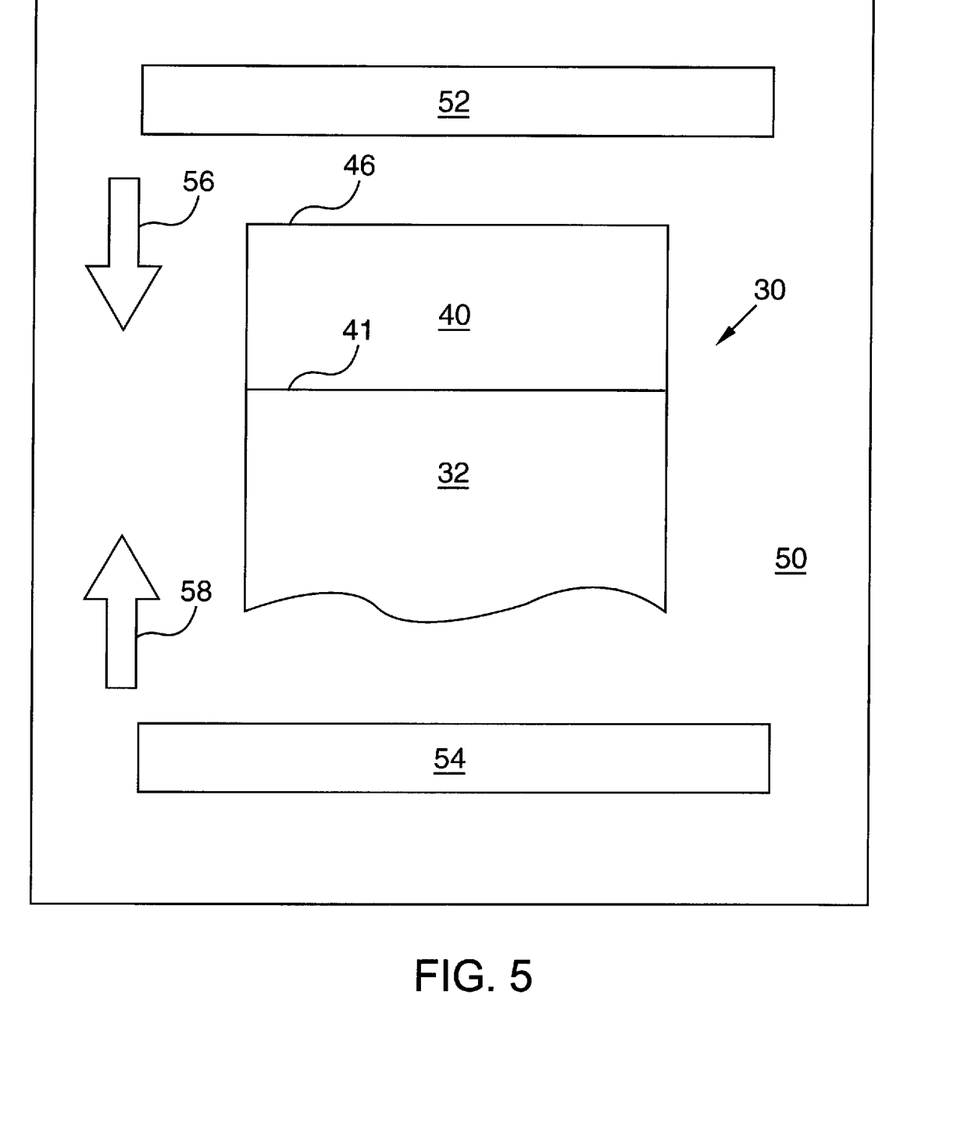
FIG. 5 depicts the wafer of FIG. 4 under temperature elevation in a heating chamber.

FIG. 5 illustrates the wafer 30 of FIG. 4 being heated in a heating chamber 50 at a heating temperature between about 450° C. and about 625° C. Note that the wafer 30 is a "test wafer" whose purpose is to facilitate a determination of heat source settings within the heating chamber 50 such that a uniform temperature in the heating chamber 50 will be achieved when a "production wafer" is subsequently placed within the heating chamber 50 for any purpose, such as for growing a film, or depositing a layer of material, on a surface of the production wafer. In particular, the present invention determines heating settings (for the heating chamber 50) that will generate a uniform temperature distribution across the test wafer 30 (and therefore also across a subsequently processed production wafer) at the desired heating temperature. Thus, the aforementioned heating settings derived for the test wafers may subsequently be used in a production environment with production wafers.

The heating chamber 50 in FIG. 5 includes any volumetric enclosure capable of heating an object placed within the heating chamber 50. As an example, the heating chamber 50 may be a rapid thermal processing (RTP) tool. The heating within the heating chamber 50 may be directed toward the wafer 30 in the direction 56 from a heat source 52 above the wafer 30. The heating within the heating chamber 50 may also be directed toward the wafer 30 in the direction 58 from a heat source 54 below the wafer 30. Either or both of heat sources 52 and 54 may be utilized in the heating chamber 50. Either or both of heat sources 52 and 54 may be a continuous heat source or a distributed array of discrete heat sources such as a distributed array of incandescent bulbs. Alternatively, the heating chamber 50 may be a furnace.

Any method of achieving the aforementioned heating temperature in the heating chamber 50 is within the scope of the present invention. For example, with the heating chamber 50 being a RPT heating chamber, the wafer 30 could be inserted into the heating chamber 50 when the heating chamber 50 is at ambient room temperature, followed by a rapid ramping up of temperature in the heating chamber 50, such as ramping at a rate between about 50° C./sec and about 100° C./sec, until the heating temperature in the heating chamber 50 is achieved. The heating temperature in the heating chamber 50 should be measured at a spatial point in the heating chamber 50 near the wafer 30 and preferably as close as possible to the wafer 30. Note that the heating temperature may deviate from uniformity across a surface 46 of the wafer 30.

Figure 6:
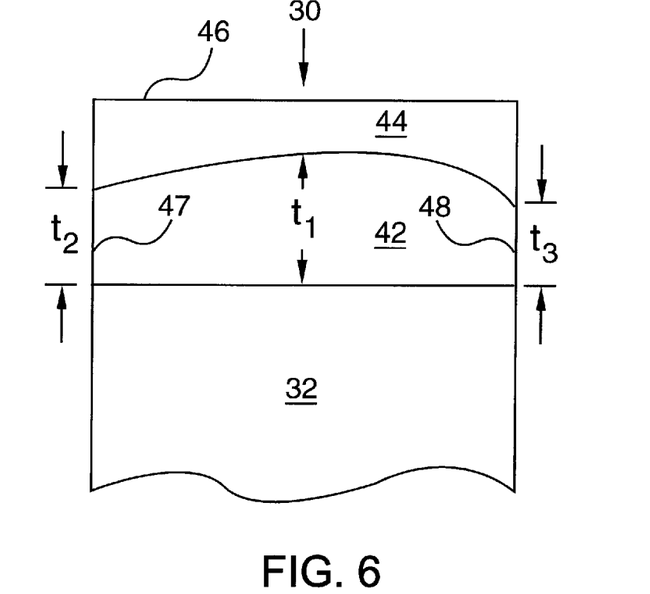
FIG. 6 depicts the wafer of FIG. 5 after a bottom portion of the amorphous layer has been transformed into a recrystallized layer having a nonuniform thickness.
Figure 7:
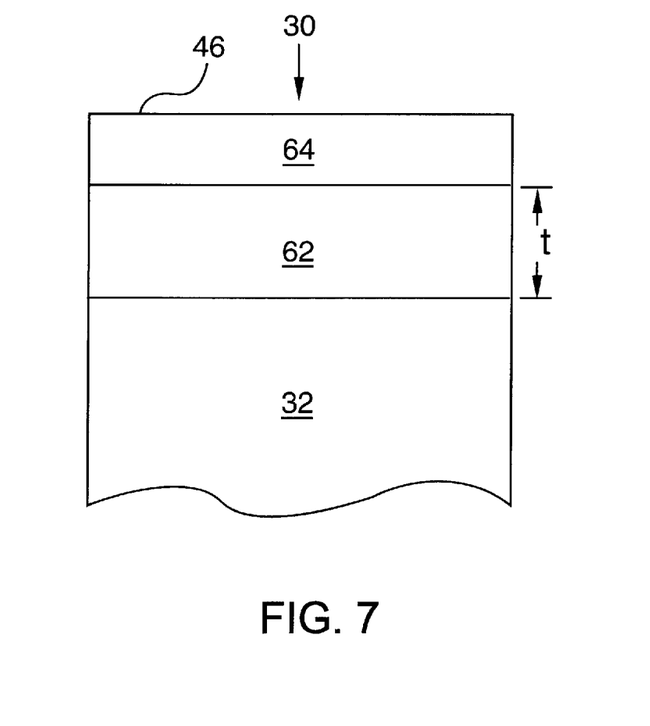
FIG. 7 depicts the wafer of FIG. 5 after a bottom portion of the amorphous layer has been transformed into a recrystallized layer having a uniform thickness.

The heating of the wafer 30 in the heating chamber 50 causes the amorphous layer 40 to recrystallize at a rate that increases with increasing temperature. The recrystallization, which occurs primarily at temperatures between about 450° C. and about 625° C., starts at a surface 41 of the amorphous layer 40, wherein the surface 41 interfaces with the substrate 32, and wherein the recrystallization proceeds in the direction 58 away from the substrate 32. If an epitaxial layer exists at the top portion of the substrate 32, as discussed supra in conjunction with FIGS. 2 and 3, then the surface 41 interfaces with the epitaxial layer. The substrate 32 (or epitaxial layer therein), that is interfaced with the surface 41 of the amorphous layer 40, acts as a "seed" that initiates the recrystallization of the amorphous layer 40. FIG. 6 illustrates a result of transforming the amorphous layer 40 of FIG. 5 into a recrystallized layer 42 and a remaining amorphous layer 44. Recalling that the rate of recrystallization increases with increasing temperature, FIG. 6 shows the recrystallized layer 42 as having a variable thickness as a consequence of a spatially varying temperature across the surface 46 of the wafer 30 during the heating of the wafer 30 in the heating chamber 50. In FIG. 6, the recrystallized layer 42 has thicknesses $t_1$, $t_2$, and $t_3$ at an interior location, at an edge 47, and at an edge 48 of the wafer 30, respectively, wherein $t_1$, $t_2$, and $t_3$ have different magnitudes. As will be explained infra, the. present invention exploits the aforementioned variable thickness of the recrystallized layer 42 to make adjustments in the spatial distribution of heat generation within the heating chamber 50 (see FIG. 5) to subsequently achieve a uniform heating temperature across the surface 46 of the wafer 30. Upon achievement of the uniform heating temperature across the surface 46 of the wafer 30, the recrystallized layer will have a uniform thickness. FIG. 7 illustrates a result of transforming the amorphous layer 40 of FIG. 5 into a recrystallized layer 62 and a remaining amorphous layer 64, wherein a heating temperature across the surface 46 of the wafer 30 is uniform, resulting in the recrystallized layer 62 having a uniform thickness t.

Figure 8:
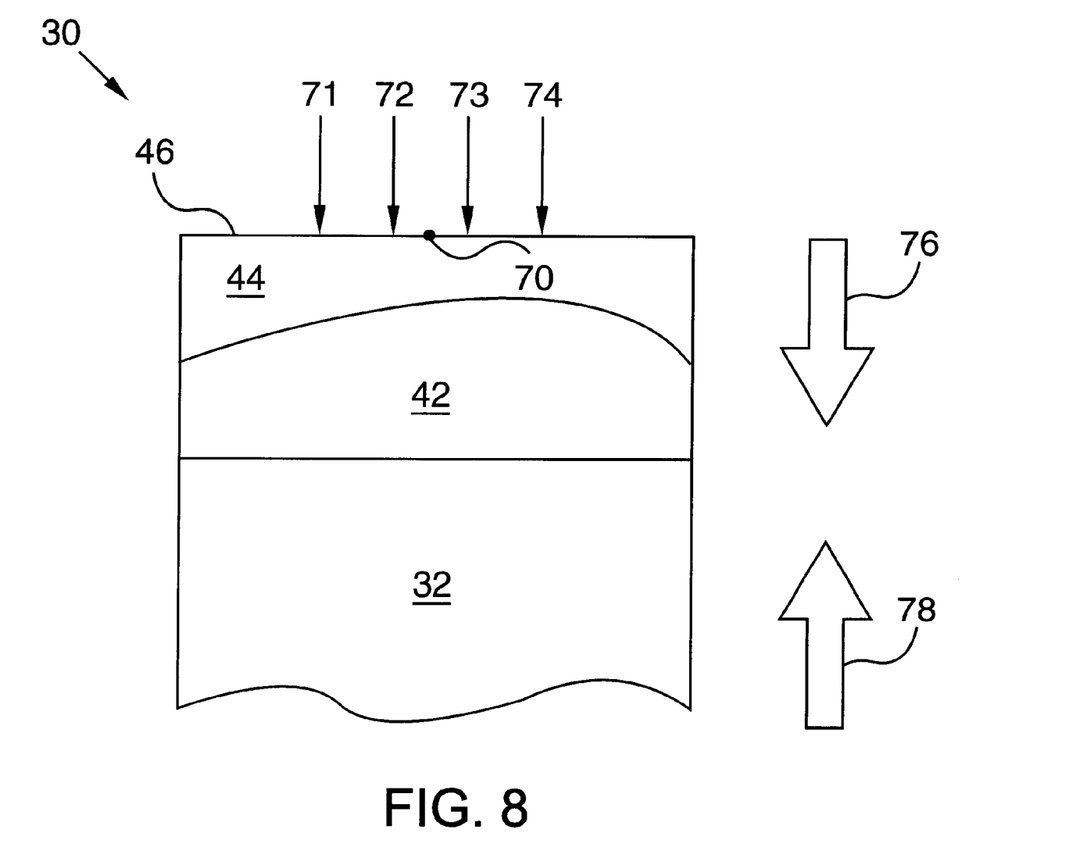
FIG. 8 depicts the wafer of FIG. 6 with a sheet. resistance being measured at a point on a wafer surface.

After heating of the wafer 30 has terminated, the sheet resistance $R_s$ at spatial points on the wafer 30 is measured by any technique known in the art. As an example, FIG. 8 depicts the wafer of FIG. 6 with a sheet resistance being measured at a point 70 on the wafer surface, by a known four-probe technique using probes 71, 72, 73, and 74, wherein probes 71 and 74 are outer probes, and wherein probes 72 and 73 are inner probes. In FIG. 8, a voltage $V_1$ is imposed between the outer probes 71 and 74, and a voltage $V_2$ is independently imposed between the inner probes 72 and 73. After the sheets resistances $R_{s1}$ and $R_{s2}$ are determined, respectively based on measured currents between the outer probes 71 and 74, and the inner probes 72 and 73, the sheet resistance at the point 70 is calculated as the arithmetic average of $R_{s1}$ and $R_{s2}$. Noting that a resistivity of the recrystallized layer 42 is negligible in comparison with a resistivity of both the remaining amorphous layer 44 and the substrate 32, which causes the constant current I to flow primarily through the recrystallized layer 42. Also noting that the substrate 32, the recrystallized layer 42, and the remaining amorphous layer 44 are in an electrically parallel combination, the measured sheet resistance $R_s$ of the wafer 30 at the point 70 is a very good approximation to the sheet resistance of the recrystallized layer 42 associated with the point 70.

The sheet resistance of the recrystallized layer 42 at the point 70 varies inversely with the thickness of the recrystallized layer 42 at the point 70. Since the thickness of the recrystallized layer 42 at the point 70 is a function of the heating temperature (at the point 70) that caused the recrystallized layer 42 to form, the measured spatial variations in sheet resistance across the surface 46 of the wafer 30 reflect corresponding spatial variations in heating temperature across the surface 46 of the wafer 30. Thus, the measured distribution of sheet resistance across the surface 46 of the wafer 30 provides guidance as to how the heat source in the heating chamber 50 should be spatially redistributed in order to achieve a greater degree of spatial homogeneity in the sheet resistance across the surface 46 of the wafer 30. The preceding sequence of the present invention (adjusting the heat source, heating a test wafer, and measuring sheet resistance across the wafer) may be iteratively repeated several times until a sufficiently uniform distribution of sheet resistance is measured. Any criterion for evaluating spatial uniformity of sheet resistance may be used, such as requiring that a maximum spatial variation, $\Delta R_s$, in measured sheet resistance over the surface of the wafer be less than a given value. Another criterion for evaluating spatial uniformity of sheet resistance is that a maximum percentage variation, $\Delta R_s/R_s$, in measured sheet resistance over the surface of the wafer be less than a given percentage. Thus far, $\Delta R_s/R_s$ of less than 2.76% has been achieved within 4 iterations, using silicon wafers implanted with $^{74}Ge^+$ at about 40 Kev to cause amorphization at an implantation density of about $5 \times 10^{14}$ atoms/cm$^3$, followed by $^{31}p^+$ at about 15 Kev to cause an implantation density of about $5 \times 10^{15}$ atoms/cm$^3$, wherein the heating temperature range was 535° C. to 585° C. The lowest value of $\Delta R_s/R_s$ that may be achieved depends on the number of iterations utilized and the sensitivity of $\Delta R_s$ to variations in wafer temperature at a given chamber temperature.

Figure 9:
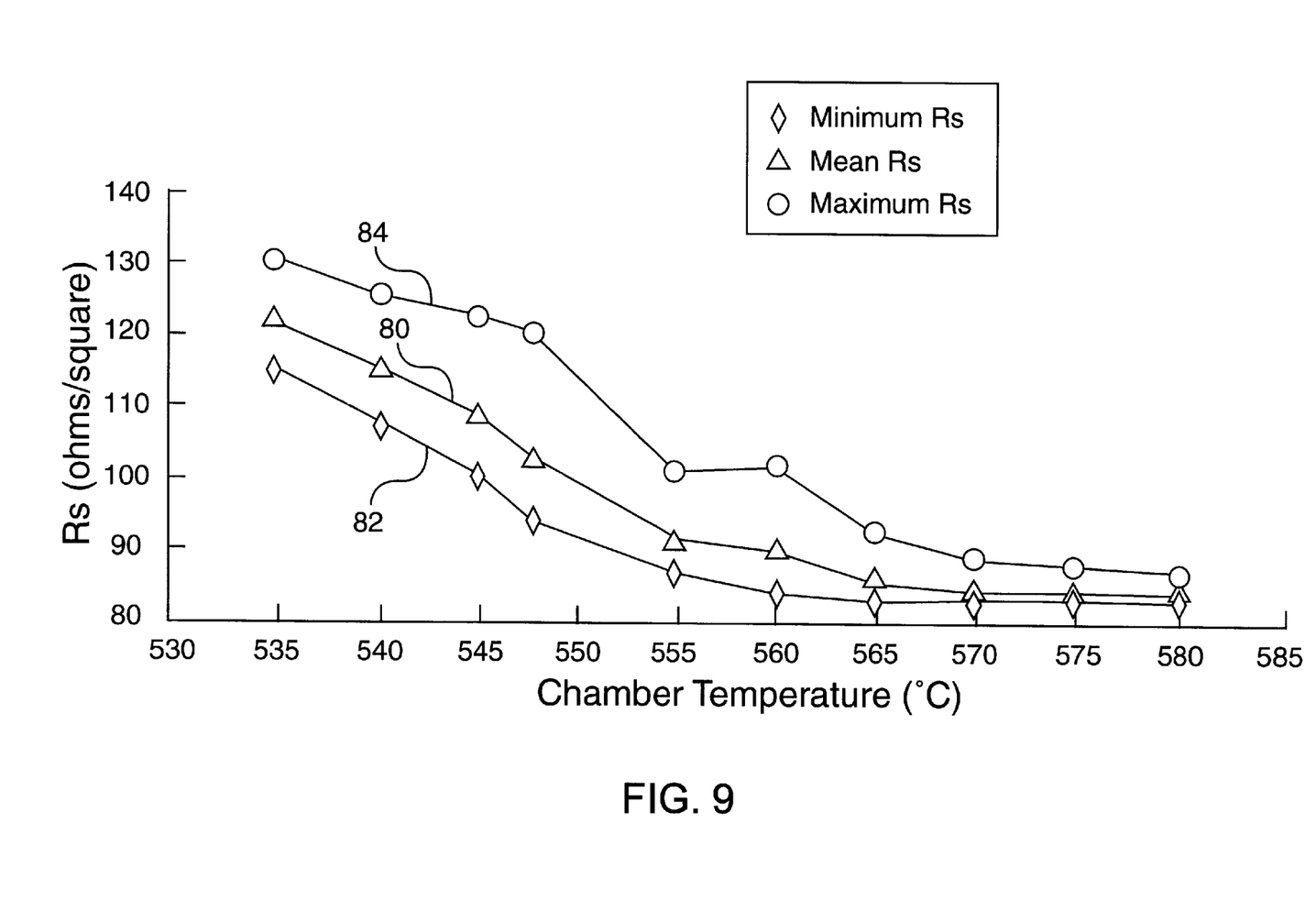
FIG. 9 depicts a plot of sheet resistance of the wafer of FIG. 6 (or FIG. 7) versus chamber temperature, after a portion of the amorphous layer on the substrate has been transformed into a recrystallized layer.

For a wafer having the implantation characteristics denoted in the preceding paragraph, and for the heating temperature range of 535° C. to 585° C. where the heating at the heating temperature was for 70 seconds, FIG. 9 illustrates a spread in $R_s$ over the wafer surface. FIG. 9 represents the spread in $R_s$ for a wafer such as the wafer 30 in FIG. 6 or FIG. 7. The indicated chamber temperature on the abscissa of FIG. 9 is a measured temperature in the heating chamber at a location in close proximity to the wafer. Curves 80, 82, and 84 respectively denote the mean, minimum, and maximum values of $R_s$ at each indicated chamber temperature, with respect to 49 spatial points on the surface of the wafer at which $R_s$ was measured. The mean curve 80 represents the arithmetic average over the 49 spatial points. The spatial point associated with the minimum curve 82 at a particular chamber temperature is not necessarily the same spatial point associated with the minimum curve 82 at another chamber temperature. The spatial point associated with the maximum curve 84 at a particular chamber temperature is not necessarily the same spatial point associated with the maximum curve 84 at another chamber temperature.

A set of curves of the type depicted in FIG. 9 may be generated at the end of each iteration of the method of the present invention, after $R_s$ is measured at all 49 spatial points. The differential between the maximum curve 84 and the minimum curve 82 reflects the full range in measured $R_s$ variation over 49 spatial points on the surface of the wafer at each chamber temperature. Additionally, the spatial distribution of $R_s$ may be utilized to adjust the temperature distribution in the heating chamber, and particularly where a wafer will be placed, by spatially redistributing the heat source within the heating chamber as discussed supra. Adjusting the temperature distribution is for the purpose of performing the next iteration of the process of the present invention, in an effort to narrow the differential between the maximum curve 84 and the minimum curve 82. The preceding steps may be repeated for as many iterations as is required for achieving a desired degree of spacial uniformity of $R_s$. As stated previously, a spatially uniform $R_s$ is indicative of a spatially uniform wafer temperature. Additionally, a spatially tuned distribution of heating, derived as an adjusted heating distribution of a given heating chamber by the method of the present invention, may be used to set an initial heating distribution for heating another wafer in another heating chamber.

The process of the present invention is increasingly effective as the slope of the $R_s$ vs. chamber temperature curve of FIG. 9 increases, since the highest slope portions of the curve occur where $R_s$ is most sensitive to wafer temperature. In FIG. 9, the highest slopes occur for chamber temperature between 535° C. and 585° C. Note that the curves in FIG. 9 are temperature insensitive at about 570° C. and above, because the amorphous layer of the wafer becomes completely recrystallized above 570° C. after 70 seconds of heating under the given implantation conditions. Thus, the implantation energy should be high enough to ensure that the amorphous layer is sufficiently thick that the amorphous layer will not totally recrystallize under the heating conditions (i.e., heating temperature and duration of heating) of the wafer in the heating chamber.

The slope in FIG. 9 could be used to convert a differential in $R_s$ to a variation in chamber temperature. For example, at a chamber temperature of 535° C., the differential in $R_s$ between the maximum curve 84 and the minimum curve 82 is about 16 ohms/square (i.e., 131 ohms/square −115 ohms/square), and the slope of the mean curve 80 at 535° C. is about −1.4 ohms/square/° C. (i.e., [122~108 ohms/square]/[535–545° C.]). Thus, the magnitude of the chamber temperature variation corresponding to the 16 ohms/square differential in $R_s$ is about 11.4° C. (i.e., [16 ohms/square]/|−1.4 ohms/square/° C.|).

Although chamber temperatures below 535° C. do not explicitly appear in FIG. 9, it should be noted that data has been collected down to 500° C. for the test conditions of FIG. 9. These collected data indicate sufficient sensitivity of $R_s$ to temperature as to render the temperature monitoring associated with the test conditions of FIG. 9 effective in the chamber temperature range of 500 to 535° C.

Several factors affect the shape or position of the curves 80, 82, and 84 of FIG. 9. A first factor is the time of exposure of the wafer 30 (see, e.g., the wafer 30 in FIG. 6 or FIG. 7) to the chamber temperature. As the time of exposure decreases, the curves 80, 82, and 84 shift upward. A second factor is the dopant species, which affects the recrystallization rate. For example, the recrystallization rate is higher with boron, rather than arsenic, as the dopant species. Note, however, that the affect of the dopant species is of second order, since the recrystallization rate is primarily determined by the characteristics of the amorphizing material (e.g., $Ge^+$). A third factor is the thickness of the amorphous layer if the amorphous layer is totally recrystallized, since as discussed supra, no further recrystallization can occur after the amorphous layer has recrystallized over its total thickness.

If the temperature distribution across a surface of a wafer is held constant during the time period of heating the amorphous layer, then a resultant sheet resistance distribution across the surface of the wafer will be invariant to the time duration of the heating, provided that the entire amorphous layer has not recrystallized. Accordingly, the time duration of heating a production wafer may differ from the time duration of heating the test wafer which was used to set the heating environment for the production wafer.

It should be noted that the wafer 30 of the present invention, as shown on FIG. 3–8, is reliable, easy to use, and inexpensive to fabricate. Additionally, the wafer 30 is reusable, because the wafer 30 is capable of being re-amorphized after it has been recrystallized. Such re-amorphization may be accomplished by any of the methods described supra herein in conjunction with FIG. 4 for performing the amorphization of either the single-implantation approach or the double-implantation approach.

While preferred and particular embodiments of the present invention have been described herein for purposes of illustration, many modifications and changes will become apparent to those skilled in the art. Accordingly, the appended claims are intended to encompass all such modifications and changes as fall within the true spirit and scope of this invention.

We claim:

1. A method for fabricating a semiconductor wafer, comprising the steps of:
    providing a substrate that includes a semiconductor material having a first dopant;
    forming an amorphous layer from a top portion of the substrate;
    doping the amorphous layer with a second dopant, wherein a polarity of the second dopant is opposite to a polarity of the first dopant; and
    heating the substrate for a period to a temperature between about 450 C. and about 625 C. such that portion of the amorphous layer is recrystallized to form a recrystallized layer, with a variable thickness without totally recrystallizing the amorphous layer, wherein such variable thickness is used to adjust a spatial distribution of heating to achieve recrystallized layer with uniform thickness.

2. The method of claim 1, wherein a thickness of the recrystallized layer is about uniform over a surface of the wafer.

3. The method of claim 1, further comprising measuring a sheet resistance at a plurality of points on a surface of the wafer, said sheet resistances characterized by a maximum spatial variation $\Delta R_s$ in measured sheet resistance over the surface of the wafer.

4. The method of claim 3, wherein a spatial distribution of the heating is adjusted to make the maximum percentage variation in measured sheet resistance over the surface of the wafer less than about 2.76%.

5. The method of claim 3, wherein a first iteration of the method comprises the providing, forming, doping, heating, and measuring steps, in addition to an adjusting step, wherein the adjusting step includes adjusting a spatial distribution of the heating by utilizing a spatial distribution of the measured sheet resistances to reduce $\Delta R_s$, in a second iteration; and further comprising after the measuring step:

performing the adjusting step; and performing the second iteration that includes repeating the forming, doping, heating, and measuring steps, wherein $\Delta R_s$, in the second iteration is less than $\Delta R_s$, in the first iteration.

6. The method of claim 5, wherein the heating of the wafer includes heating the wafer in a first heating chamber, and further comprising utilizing the adjusted heating distribution of the first heating chamber to set an initial heating distribution for heating a second wafer in a second heating chamber.

7. The method of claim 1, wherein the semiconductor material includes silicon.

8. The method of claim 1, wherein the step of forming an amorphous layer includes directing an ionic species into the top portion of the substrate.

9. The method of claim 8, wherein the ionic species includes $^{74}Ge^+$, and wherein the second dopant includes $^{31}P^+$.

10. The method of claim 1, wherein the forming step and the doping step are executed concurrently such that the second dopant causes the amorphous layer to form.

11. The method of claim 10, wherein the second dopant includes ionic arsenic.

12. A method for fabricating a semiconductor wafer, comprising the steps of:

providing a substrate that includes a semiconductor material having a first dopant;

forming an amorphous layer from a top portion of the substrate;

doping the amorphous layer with a second dopant, wherein a polarity of the second dopant is opposite to a polarity of the first dopant;

heating the wafer for a time period to a temperature between about 450° C. and about 625° C., wherein a portion of the amorphous layer is recrystallized to form a recrystallized layer with variable thickness such variable thickness is used to adjust a spatial distribution of heating to achieve recrystallized layer with uniform thickness, and wherein the recrystlized layer is in contact with the substrate; and measuring a sheet resistance at a plurality of points on a surface of the wafer, said sheet resistances characterized by a maximum spatial variation $\Delta R_s$, in measured sheet resistance over the surface of the wafer; and wherein a spatial distribution of the heating is adjusted to make the maximum percentage variation in measured sheet resistance over the surface of the wafer less than about 2.76%.

13. The method of claim 12, wherein a first iteration of the method comprises the providing, forming, doping, heating, and measuring steps, in addition to an adjusting step, wherein the adjusting step includes adjusting a spatial distribution of the heating by utilizing a spatial distribution of the measured sheet resistances to reduce $\Delta R_s$ in a second iteration; and further comprising after the measuring step:

performing the adjusting step; and performing the second iteration that includes repeating the forming, doping, heating, and measuring steps, wherein $\Delta R_s$ in the second iteration is less than $\Delta R_s$ in the first iteration.

14. The method of claim 13, wherein the heating of the wafer includes heating the wafer in a first heating chamber, and further comprising utilizing the adjusted heating distribution of the first heating chamber to set an initial heating distribution for heating a second wafer in a second heating chamber.

* * * * *